United States Patent
Kwon et al.

(10) Patent No.: US 9,759,791 B2
(45) Date of Patent: Sep. 12, 2017

(54) MAGNETIC RESONANCE IMAGING APPARATUS AND MANUFACTURING METHOD THEREOF

(71) Applicant: SAMSUNG ELECTRONICS CO., LTD., Suwon-si (KR)

(72) Inventors: Oh Soo Kwon, Seoul (KR); Dong Keun Park, Suwon-si (KR); Jun Suk Kwak, Gwangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 467 days.

(21) Appl. No.: 14/458,896

(22) Filed: Aug. 13, 2014

(65) Prior Publication Data
US 2015/0048832 A1   Feb. 19, 2015

(30) Foreign Application Priority Data

Aug. 13, 2013 (KR) .................. 10-2013-0095850
Aug. 12, 2014 (KR) .................. 10-2014-0104418

(51) Int. Cl.
*G01R 33/3873* (2006.01)
*G01R 33/38* (2006.01)
*G01R 33/385* (2006.01)

(52) U.S. Cl.
CPC ..... *G01R 33/3873* (2013.01); *G01R 33/3804* (2013.01); *G01R 33/3856* (2013.01)

(58) Field of Classification Search
CPC ............ G01R 33/3873; G01R 33/3804; G01R 33/3856
See application file for complete search history.

(56) References Cited

U.S. PATENT DOCUMENTS

| 6,218,839 | B1 | 4/2001 | Shaikh et al. |
| 2006/0208732 | A1* | 9/2006 | Shen .................. G01R 33/3873 324/314 |
| 2008/0169813 | A1 | 7/2008 | Yamashita et al. |
| 2010/0085053 | A1* | 4/2010 | Iwasa ................. G01R 33/3804 324/318 |
| 2010/0237867 | A1* | 9/2010 | Slade ................. G01R 33/3873 324/314 |
| 2011/0074421 | A1 | 3/2011 | Sakakura |

(Continued)

FOREIGN PATENT DOCUMENTS

| GB | 2483854 A | 3/2012 |
| JP | 2006-311957 A | 11/2006 |

(Continued)

OTHER PUBLICATIONS

Communication dated Nov. 23, 2015, issued by the Korean Intellectual Property Office in corresponding Korean Application No. 10-2014-0104418.

(Continued)

*Primary Examiner* — Rodney Bonnette
(74) *Attorney, Agent, or Firm* — Sughrue Mion, PLLC

(57) ABSTRACT

The MRI apparatus includes a main magnet forming a static magnetic field in a bore, and a gradient coil assembly which forms a magnetic field gradient in the static magnetic field and includes a plurality of shim trays arranged therein at a predefined interval and at least one first shim token provided between the shim trays.

29 Claims, 18 Drawing Sheets

(56) References Cited

U.S. PATENT DOCUMENTS

| | | | |
|---|---|---|---|
| 2014/0009152 A1* | 1/2014 | Sakakibara | G01R 33/3802 324/307 |
| 2014/0062484 A1* | 3/2014 | Kwak | G01R 33/3804 324/322 |
| 2015/0168520 A1* | 6/2015 | Kwak | G01R 33/4215 324/318 |

FOREIGN PATENT DOCUMENTS

| | | |
|---|---|---|
| JP | 2008-194449 A | 8/2008 |
| JP | 2011-115480 A | 6/2011 |
| JP | 2012-217573 A | 11/2012 |

OTHER PUBLICATIONS

Communication dated Aug. 26, 2016, issued by the Korean Intellectual Property Office in counterpart Korean application No. 10-2014-0104418.
Office Action, dated Apr. 20, 2016, issued in corresponding KR Application No. 10-2014-0104418, 3 pages.
Search Report dated Nov. 20, 2014 issued in International Application No. PCT/KR2014/007542 (PCT/ISA/210).
Communication dated Jul. 7, 2017 from the European Patent Office in counterpart European Application No. 14836040.7.

* cited by examiner

MAGNETIC RESONANCE IMAGING APPARATUS AND MANUFACTURING METHOD THEREOF

CROSS-REFERENCE TO RELATED APPLICATIONS

This application claims priority from Korean Patent Application No. 10-2013-0095850 filed on Aug. 13, 2013, and Korean Patent Application No. 10-2014-0104418 filed on Aug. 12, 2014, in the Korean Intellectual Property Office, the disclosures of which are incorporated herein by reference in their entireties.

BACKGROUND

1. Field

Apparatuses and methods consistent with exemplary embodiments relate to a magnetic resonance imaging (MRI) apparatus and a method of manufacturing the MRI apparatus.

2. Description of the Related Art

The MRI apparatus acquires images of the internal areas of the human body by supplying a certain frequency and energy to an atomic nucleus in a state of applying a certain magnetic field to the atomic nucleus to convert energy released from the atomic nucleus into signals.

Each proton constituting atomic nucleuses has spin angular momentum and a magnetic dipole alone. Accordingly, when a magnetic field is applied to the atomic nucleuses, the atomic nucleuses are aligned in a direction of the magnetic field and perform precession about the direction of the magnetic field. Such precession allows an image of the human body to be acquired through a nuclear magnetic resonance.

The MRI apparatus acquires an image of an object by forming magnetic field gradients in a static magnetic field which is formed in an imaging region by a main magnet. To maintain an accuracy of imaging, a static magnetic field in the imaging region needs to be uniform, and, thus, the MRI apparatus is provided with a shim to increase the uniformity of the static magnetic field.

For example, the shims may be provided within a gradient coil assembly. However, a great number of shims is required to increase the uniformity of a static magnetic field, and, thus, the thickness of the gradient coil assembly in a radial direction may be increased. This is problematic because it causes a reduction in an inner space of a bore of an MRI scanner.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide an MRI apparatus including a shim token provided between shim trays in a gradient coil assembly, and a method of manufacturing the MRI apparatus.

In accordance with an exemplary embodiment, an MRI apparatus includes a main magnet forming a static magnetic field in a bore, and a gradient coil assembly which forms a magnetic field gradient in the static magnetic field and includes a first shim token provided therein so that a distribution of the static magnetic field is uniform.

The first shim token may be configured so that at least one first shim token is arranged between a plurality of shim trays provided within the gradient coil assembly.

The first shim token may be configured so that at least one first shim token is installed at a position between the shim trays corresponding to a position of at least one of a plurality of shim pockets in the shim trays.

The gradient coil assembly may include a plurality of holders arranged between a plurality of shim trays provided within the gradient coil assembly, each of the holders including the first shim token therein.

Each of the holders may accommodate the first shim token at a position corresponding to a position of at least one of a plurality of shim pockets of each shim tray.

The gradient coil assembly may include a plurality of holders which are parallel with a central axis of the bore and are arranged at a predefined interval along a circumferential direction of the bore, each of the holders including the first shim token therein.

Each of the holders may accommodate one or more first shim tokens installed therein at a predefined interval.

The gradient coil assembly may include a plurality of cooling portions arranged at a predefined interval.

The gradient coil assembly may include at least one first shim token provided between the plurality of cooling portions.

The plurality of cooling portions each may be provided within the gradient coil assembly in a shape extending in a circumferential direction of the gradient coil assembly, and arranged at a predefined interval along a central axis direction of the of the gradient coil assembly.

The gradient coil assembly may include at least one first shim token formed between the plurality of cooling portions arranged along the central axis direction of the gradient coil assembly.

The plurality of cooling portions each may be provided within the gradient coil assembly in a shape extending in a central axis direction of the gradient coil assembly, and arranged at a predefined interval along a circumferential direction of the gradient coil assembly.

The gradient coil assembly may include at least one first shim token formed between the plurality of cooling portions arranged along the circumferential axis direction of the gradient coil assembly In accordance with an exemplary embodiment, an MRI apparatus includes a main magnet forming a static magnetic field in a bore, and a gradient coil assembly which forms a magnetic field gradient in the static magnetic field and includes a plurality of shim trays arranged therein at a predefined interval and a plurality of first shim tokens configured so that at least one first shim token is provided between the shim trays.

The gradient coil assembly may include a plurality of shim accommodation portions which extend in a direction parallel with a central axis of the gradient coil assembly so that the shim trays are capable of being inserted into the shim accommodation portions and are arranged at a predefined interval along a circumferential direction of the gradient coil assembly, and the shim trays which are inserted into the shim accommodation portions and include a plurality of divided shim pockets capable of accommodating second shim tokens, and the first shim tokens may be configured so that at least one first shim token is provided between the shim trays along a direction parallel with the central axis.

The first shim tokens may be configured so that at least one first shim token is installed at a position between the shim trays corresponding to a position of at least one of a plurality of shim pockets in the shim trays.

The gradient coil assembly may include a plurality of holders which are arranged between the shim trays provided within the gradient coil assembly and include the first shim tokens therein.

Each of the holders may accommodate the associated first shim token at a position corresponding to a position of at least one of a plurality of shim pockets of the shim trays.

In accordance with an exemplary embodiment, a method of manufacturing an MRI apparatus includes measuring a static magnetic field distribution of a bore, determining an installation position of a first shim token within a gradient coil assembly in order to improve uniformity of the static magnetic field distribution, based on the measured result, and installing the first shim token at the installation position within the gradient coil assembly, based on the determined result.

The determining the installation position of the first shim token may include determining the installation position of the first shim token as at least one position between shim trays among positions corresponding to shim pockets of the shim trays in order to improve uniformity of the static magnetic field distribution, based on the measured result.

The method may further include, when the installation position of the first shim token is determined, determining at least one of the number, shape, weight, and size of the first shim token to be installed at the determined installation position.

The method may further include, when the first shim token is installed, measuring a static magnetic field distribution of the bore and installing a shim tray provided with a second shim token within the gradient coil assembly based on the same.

The installing the shim tray within the gradient coil assembly may include re-measuring a static magnetic field distribution of the bore, determining a shim pocket of the shim tray in which the second shim token is to be arranged in order to improve uniformity of the static magnetic field distribution, based on the re-measured result, arranging the second shim token in the determined shim pocket, based on the determined result, and installing the shim tray in which the second shim token is arranged to a shim accommodation portion of the gradient coil assembly.

The method may further include determining at least one of the number, shape, weight, and size of the second shim token to be installed to the determined shim pocket.

The method may further include, when the shim tray is installed, measuring a static magnetic field of the bore and determining whether uniformity of the measured static magnetic field is above a predetermined reference uniformity.

In accordance with an exemplary embodiment, a method of manufacturing an MRI apparatus includes measuring a static magnetic field distribution of a bore, determining a shim pocket of a shim tray in which each second shim token is to be arranged in order to improve uniformity of the static magnetic field distribution, based on the measured result, determining an installation position of a first shim token as at least one position between the shim trays among positions corresponding to the determined shim pockets, based on the measured result, and installing the shim tray provided with the second shim token and the first shim token within a gradient coil assembly, based on the determined result.

The determining the shim pocket of the shim tray in which each second shim token is to be arranged in order to improve uniformity of the static magnetic field distribution based on the measured result may include determining the shim pocket of the shim tray in which each second shim token is to be arranged in order to improve uniformity of the static magnetic field distribution based on the measured result and determining at least one of the number, shape, weight, and size of the second shim token to be arranged in the determined shim pocket.

The determining the installation position of the first shim token as at least one position between the shim trays among positions corresponding to the determined shim pockets based on the measured result may include determining the installation position of the first shim token as at least one position between the shim trays among positions corresponding to the determined shim pockets based on the measured result and determining at least one of the number, shape, weight, and size of the first shim token to be installed at the determined installation position.

The method may further include, when the shim tray and the first shim token are installed within the gradient coil assembly, measuring a static magnetic field of the bore and determining whether uniformity of the measured static magnetic field is above a predetermined reference uniformity.

BRIEF DESCRIPTION OF THE DRAWINGS

The above and/or other aspects will be more apparent by describing certain exemplary embodiments, with reference to the accompanying drawings, which.

DETAILED DESCRIPTION

Figure 1:
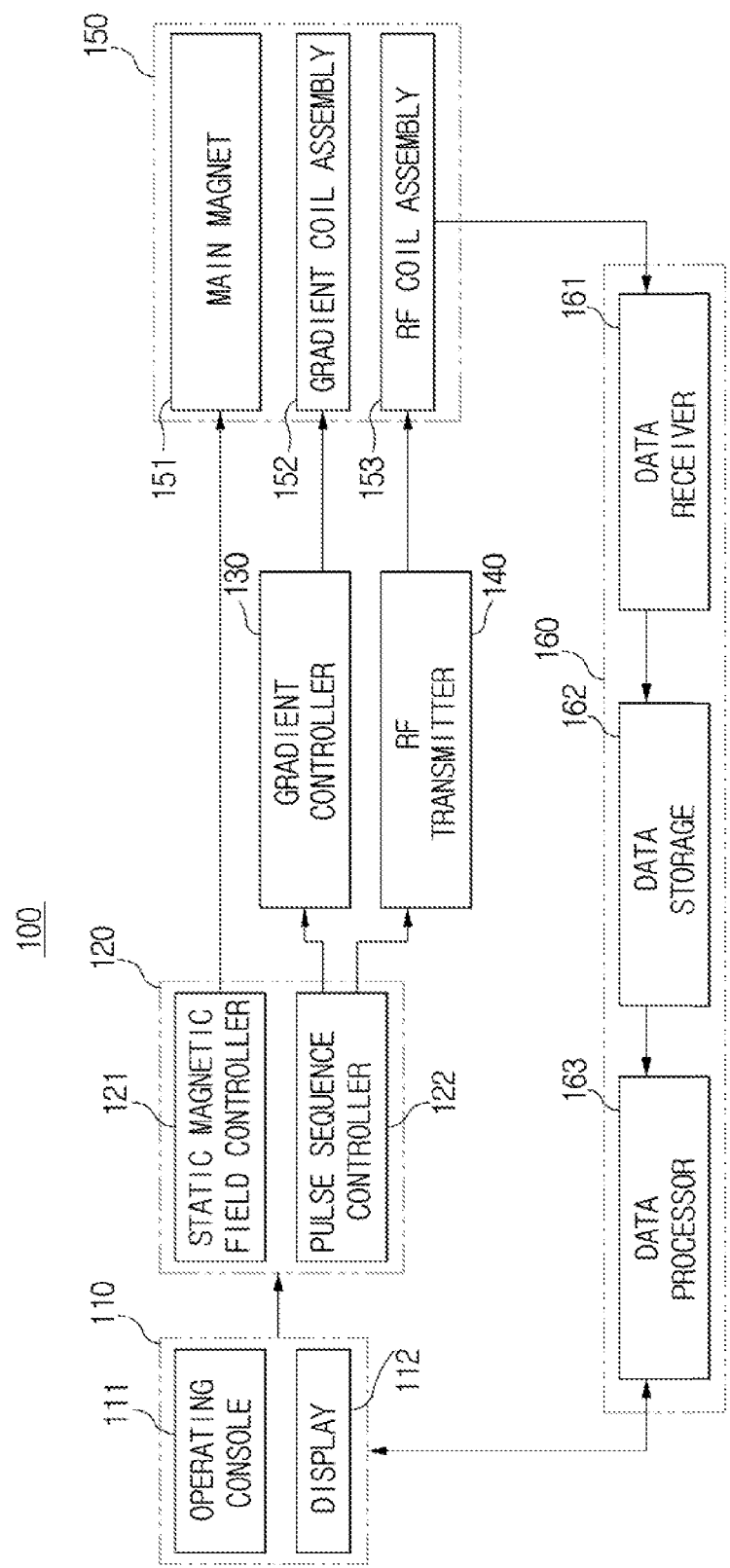
FIG. 1 is a control block diagram of an MRI apparatus according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

FIG. 1 is a control block diagram of an MRI apparatus according to an exemplary embodiment.

Referring to FIG. 1, an MRI apparatus according to an exemplary embodiment includes a magnet assembly 150 which forms a magnetic field and generates a resonance with respect to an atomic nucleus, a controller 120 to control operation of the magnet assembly 150, and an image processor 160 which receives an echo signal generated by the atomic nucleus to produce a magnetic resonance image.

The magnet assembly 150 includes a main magnet 151 forming a static magnetic field therein, a gradient coil assembly 152 forming a magnetic field gradient in the static magnetic field, and an RF coil assembly 153 which receives the echo signal from the atomic nucleus by applying an RF pulse and exciting the atomic nucleus.

The controller 120 includes a static magnetic field controller 121 to control intensity and a direction of the static magnetic field formed by the main magnet 151, and a pulse sequence controller 122 which designs a pulse sequence and controls the gradient coil assembly 152 and the RF coil assembly 153 according thereto.

The MRI apparatus according to an exemplary embodiment includes a gradient controller 130 which applies a gradient signal to the gradient coil assembly 152 and an RF transmitter 140 which applies an RF signal to the RF coil assembly 153. The MRI apparatus may thereby allow the pulse sequence controller 122 to control the gradient controller 130 and the RF transmitter 140, enabling adjustment of the magnetic field gradient formed in the static magnetic field and an RF applied to the atomic nucleus.

The MRI apparatus according to an exemplary embodiment includes a user operating station 110. Consequently, the MRI apparatus receives control commands related to operation of the MRI apparatus 100, particularly may receive a command related to a scan sequence from a user and produce a pulse sequence depending thereupon.

The user operating station 110 may include an operating console 111 provided so that a user may operate a system, and a display 112 which displays a control state and an image produced by the image processor 160 so that a user may provide a diagnostic information about the health of an object 200.

Figure 2:
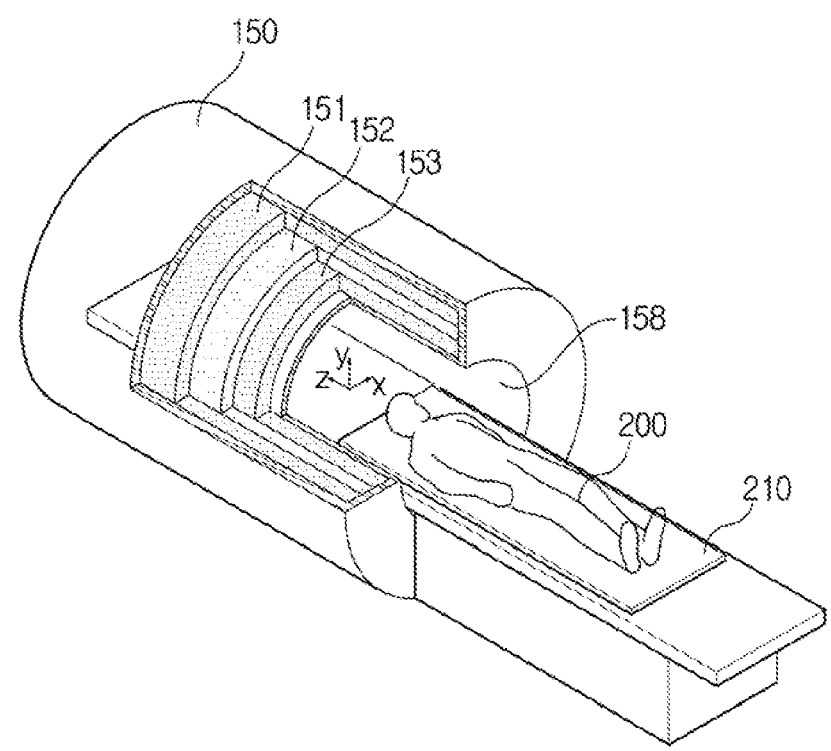
FIG. 2 is a view schematically illustrating the MRI apparatus.
Figure 3:
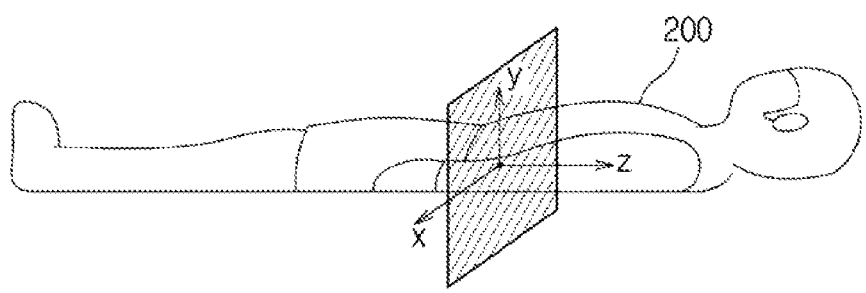
FIG. 3 is a view illustrating a space, in which an object is positioned, divided into the x-, y-, and z-axes.
Figure 4A:
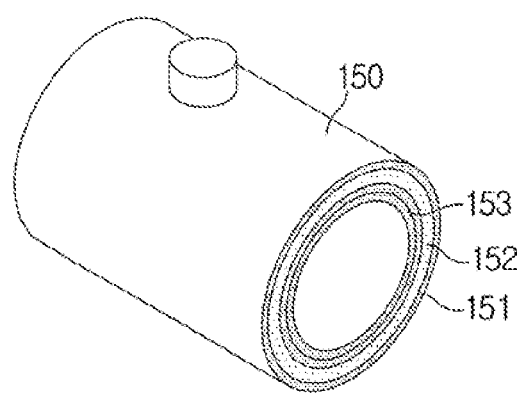
FIGS. 4A and 4B are views illustrating structures of a magnet assembly and a gradient coil assembly.
Figure 4B:
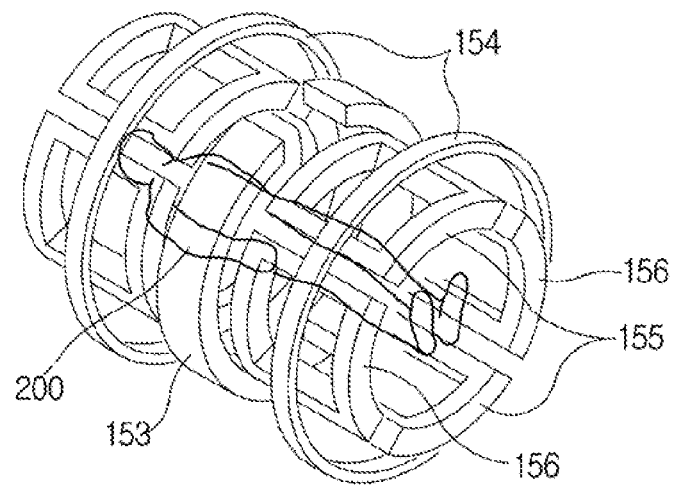
Figure 5:
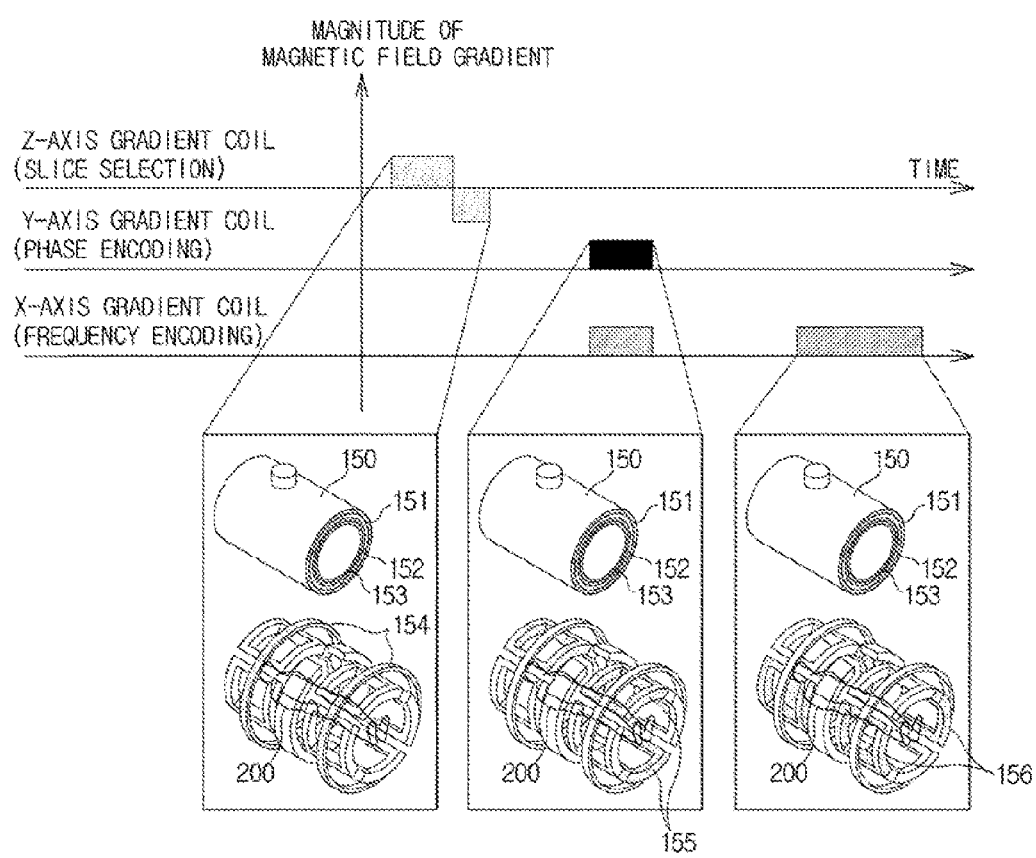
FIG. 5 is a diagram illustrating gradient coils and pulse sequences related to operation of the gradient coils.

FIG. 2 is a view schematically illustrating the MRI apparatus. FIG. 3 is a view illustrating a space, in which an object is positioned, divided into the x-, y-, and z-axes. FIGS. 4A and 4B are views illustrating structures of the magnet assembly and the gradient coil assembly. FIG. 5 is a diagram illustrating gradient coils of the gradient coil assembly and pulse sequences related to operation of the gradient coils.

Hereinafter, operation of the above-mentioned magnetic resonance imaging device according to an exemplary embodiment will be described in more detail with reference to FIG. 1.

The magnet assembly 150 is formed in a cylindrical shape having an empty inner space, i.e., a bore 158. A patient bed 210 conveys the object 200 to the bore, to obtain an MR signal.

The magnet assembly 150 includes the main magnet 151, the gradient coil assembly 152, and the RF coil assembly 153.

The main magnet 151 may be a coil wound around the bore. When a current is applied to the main magnet 151, a static magnetic field is formed within the magnet assembly 150, i.e., in the bore 158.

The direction of the static magnetic field is generally parallel with the same axis of the magnet assembly 150.

When a static magnetic field is formed in the bore, atoms constituting the object 200, particularly atomic nucleuses of hydrogen atoms are aligned in a direction of the static magnetic field and perform precession about the direction of the static magnetic field. The rate of precession of each atomic nucleus may be indicated as a precession frequency, the precession frequency, referred to as the Larmor frequency, is expressed by the following Equation 1:

$$\omega = \gamma B_0 \qquad \text{[Equation 1]}$$

where $\omega$ is a Larmor frequency,
$\gamma$ is a proportional constant, and
$B_0$ is an intensity of an external magnetic field.

The proportional constant differs for each type of atomic nucleus, the unit of the intensity of the external magnetic field is Tesla (T) or Gauss (G), and the unit of the precession frequency is Hz.

For example, since the hydrogen proton has a precession frequency of 42.58 MHz in an external magnetic field of 1 T and hydrogen occupies the greatest proportion of atoms constituting the human body, the MR signal is mainly obtained using the precession of the hydrogen protons.

The gradient coil assembly 152 generates a magnetic field gradient in the static magnetic field.

As shown in FIG. 3, an axis parallel with a direction from the head to the feet of the object 200 is an axis parallel with a direction of the static magnetic field and may be referred to as the z-axis, an axis parallel with a left and right direction of the object 200 may be referred to as the x-axis, and an axis, which is perpendicular to the x-axis and the z-axis and is parallel with an upward and downward direction within the bore, may be referred to as the y-axis.

In order to obtain three-dimensional (3D) spatial information, magnetic field gradients are needed for all of the x-, y-, and z-axes. Thus, the gradient coil assembly 152 includes three pairs of gradient coils.

As shown in FIGS. 4A, 4B, and 5, a z-axis gradient coil 154 includes a pair of ring coils, y-axis gradient coils 155 which are located above and beneath the object 200, and x-axis gradient coils 156 which are located to the left and right of the object 200.

If direct currents having opposite polarities flow at the two respective z-axis gradient coils 154 in opposite directions, a variation in magnetic field is generated in the z-axis direction, resulting in a gradient magnetic field. FIG. 5 shows formation of a z-axis magnetic field gradient during operation of each z-axis gradient coil 154 as a pulse sequence.

A thinner slice may be selected as an intensity of a magnetic field gradient formed in the z-axis direction is increased, and the z-axis gradient coil 154 is used to select a slice.

When a slice is selected through the magnetic field gradient formed by the z-axis gradient coil 154, all of the spins of the slice have the same frequency and phase. Consequently, the spins may not be individually distinguished.

In this case, when a magnetic field gradient is formed in the y-axis direction by the y-axis gradient coil 155, a phase shift is generated so that spins constituting lines of the slice have different phases from each other.

When the y-axis magnetic field gradient is formed, the spins in the lines to which a large magnetic field gradient is applied are phase-shifted to a high frequency and the spins in the lines to which a small magnetic field gradient is applied are phase-shifted to a low frequency.

When the y-axis magnetic field gradient disappears, the phase-shift is generated in each of the lines of the selected slice and the lines have different phases from each other. Consequently, the lines may be distinguished from each other.

The magnetic field gradient generated by the y-axis gradient coil 155 is used in phase encoding. FIG. 5 shows formation of the y-axis magnetic field gradient during operation of each y-axis gradient coil 155 as a pulse sequence.

A slice is selected through the magnetic field gradient formed by the z-axis gradient coil 154, and lines constituting the selected slice are distinguished by different phases from each other through the magnetic field gradient formed by the y-axis gradient coil 155. However, since respective spins constituting the lines have the same frequency and phase, the spins may not be individually distinguished.

In this case, a magnetic field gradient is formed in the x-axis direction by the x-axis gradient coil 156, which allows the spins constituting the respective lines to have different frequencies from each other, thereby enabling the spins to be individually distinguished from each other. As such, the magnetic field gradient generated by the x-axis gradient coil 156 is used in frequency encoding.

As described above, the magnetic field gradients formed by the z-, y-, and x-axes gradient coils encode spatial positions of the respective spins via the slice selection, the phase encoding, and the frequency encoding, respectively.

The gradient coil assembly 152 is connected to the gradient controller 130, and the gradient controller 130 applies a drive signal to the gradient coil assembly 152 depending upon a control signal transmitted from the pulse sequence controller 122 to generate the magnetic field gradient. The gradient controller 130 may include three drive circuits corresponding to three pairs of gradient coils 154, 155, and 156.

As described above, the atomic nucleuses aligned by the external magnetic field precess according to the Larmor frequency, and a vector sum of magnetizations of several atomic nucleuses may be indicated as one net magnetization M.

Since a z-axis component of the net magnetization is impossible to be measured, $M_{xy}$ alone may be measured. Accordingly, the net magnetization has to be present on the X-Y plane by excitation of the atomic nucleus, in order to obtain an MR signal. An RF pulse tuned to the Larmor frequency of the atomic nucleus has to be applied to a static magnetic field for excitation of the atomic nucleus.

The RF coil assembly 153 includes a transmit coil to transmit an RF pulse and a receive coil to receive an electromagnetic wave emitted from the excited atomic nucleus, namely, an MR signal.

The RF coil assembly 153 is connected to the RF transmitter 140, and the RF transmitter 140 applies a drive signal to the RF coil assembly 153 depending upon a control signal transmitted from the pulse sequence controller 122 to transmit the RF pulse.

The RF transmitter 140 may include a modulation circuit to modulate a high frequency output signal into a pulse signal and an RF power amplifier to amplify the pulse signal.

The RF coil assembly 153 is connected to the image processor 160. The image processor 160 includes a data receiver 161 to receive data related to the MR signal generated by the atomic nucleus, and a data processor 163 processing the data received from the data receiver 161 to produce a magnetic resonance image.

The data receiver 161 includes a preamplifier to amplify the MR signal received by the receive coil of the RF coil assembly 153, a phase detector which receives the MR signal from the preamplifier to detect a phase, and an analog-to-digital (A/D) converter to convert an analog signal obtained through the phase detection into a digital signal. The data receiver 161 transmits the digital converted magnetic resonance signal to a data storage 162.

The data storage 162 has a data space constituting a two-dimensional (2D) Fourier space. When overall data scan of which is completed is stored in the data storage 162, the data processor 163 processes the data within the 2D Fourier space using a 2D inverse Fourier transform to reconstruct an image of the object 200. The reconstructed image is displayed on the display 112.

A spin echo pulse sequence is used to obtain the MR signal from the atomic nucleus. When the RF pulse is applied by the RF coil assembly 153, the RF coil assembly 153 transmits an RF pulse again at a proper time after a first RF pulse is applied. Strong transverse magnetization appears in the atomic nucleuses when time Δt elapses after transmission of the second RF pulse, with the consequence that the MR signal may be obtained. This is referred to as the spin echo pulse sequence, and Time Echo (TE) refers to a time needed to generate the MR signal after application of the first RF pulse.

A level in which the proton is flipped to a degree may be indicated as an angle moving from an axis at which the proton is located before a flip, and is indicated as a 90-degree RF pulse, a 180-degree RF pulse, or the like according to a flip level.

Figure 6:
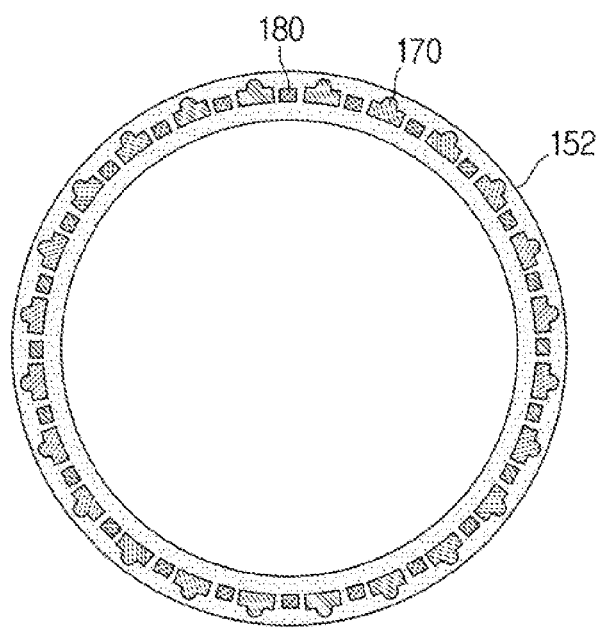
FIG. 6 is a cross-sectional view of the gradient coil assembly according to an exemplary embodiment.
Figure 7:
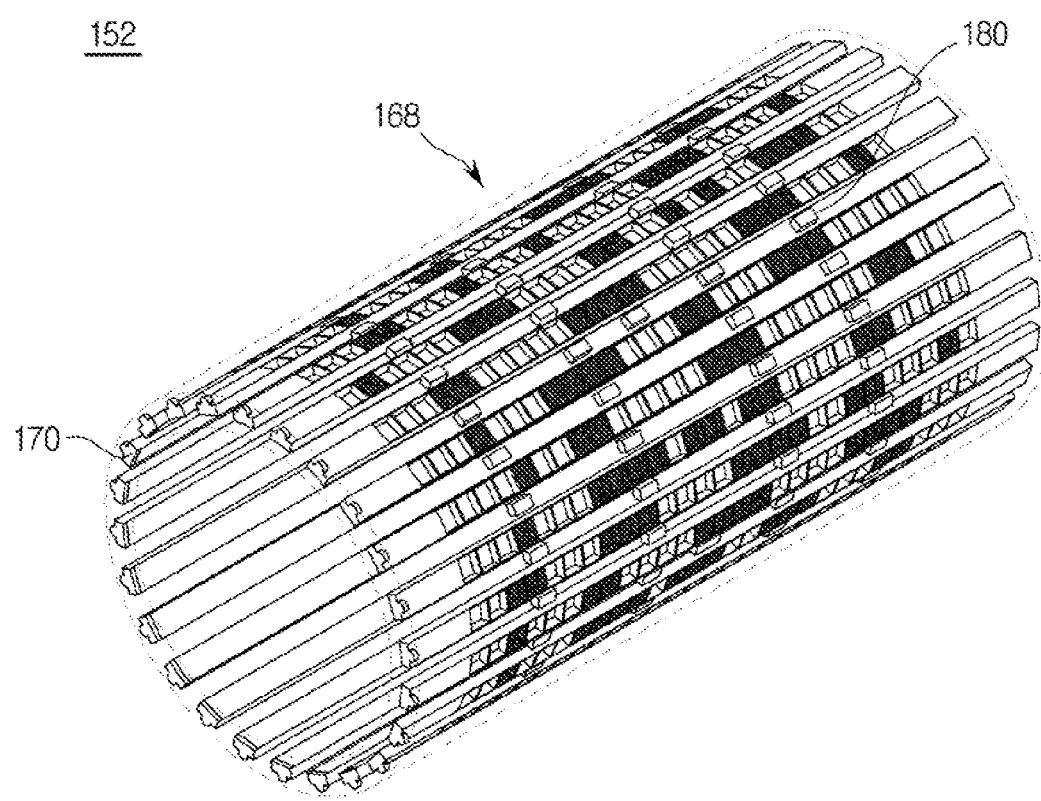
FIG. 7 is a view illustrating shim trays and first shim tokens installed within the gradient coil assembly according to an exemplary embodiment.
Figure 8:
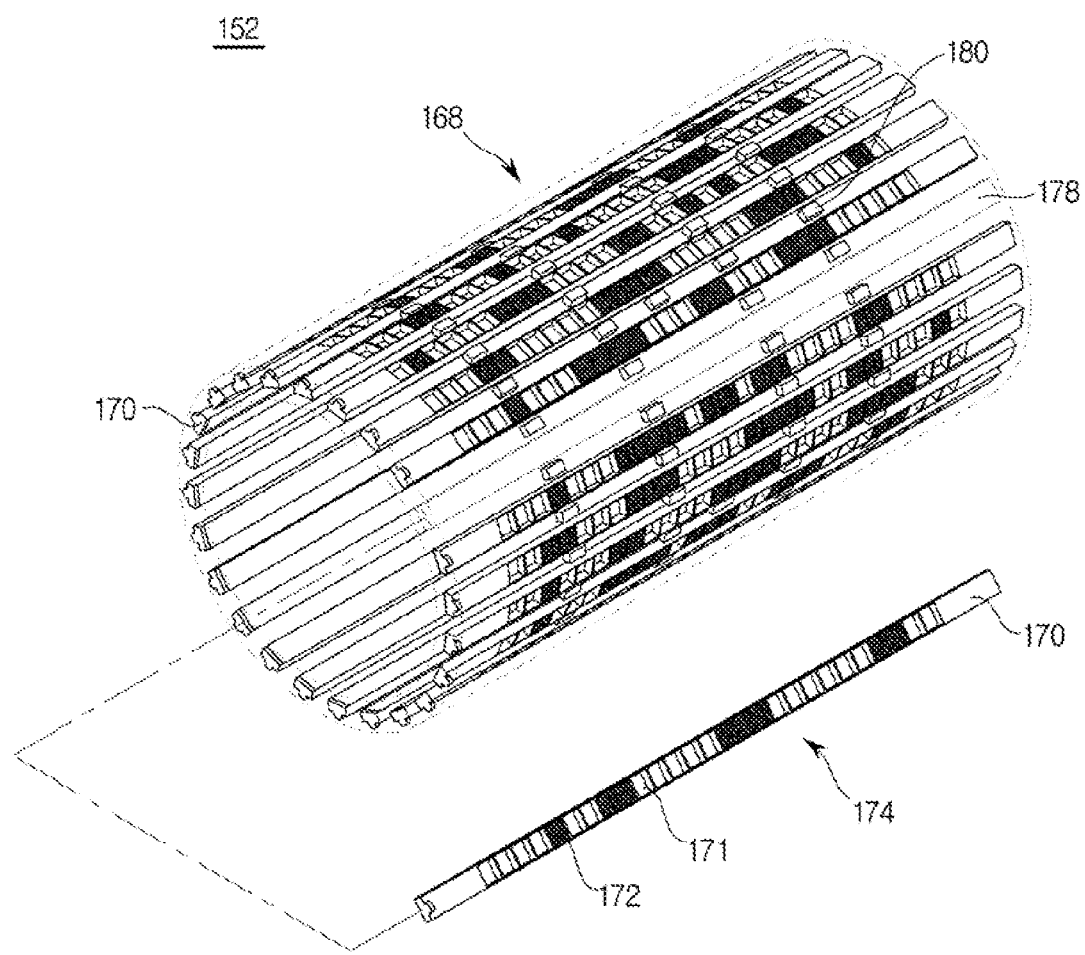
FIG. 8 is a view illustrating shim trays and first shim tokens installed within the gradient coil assembly according to an exemplary embodiment.

FIG. 6 is a cross-sectional view of the gradient coil assembly 152 according to an exemplary embodiment. FIGS. 7 and 8 are views illustrating shim trays 170 and first shim tokens 180 installed within the gradient coil assembly 152 according to an exemplary embodiment.

In addition, the gradient coil assembly 152 may include a shield coil (not shown). Since the shield coil is provided outside the gradient coil, the shield coil has an installation radius greater than the gradient coil.

If a pulse current is applied to the gradient coil, eddy current may flow in the main magnet surrounding the gradient coil in a direction suppressing generation of the magnetic field gradient.

If the eddy current is induced in the main magnet, linearity of the magnetic field gradient is deteriorated on the time axis. When the eddy current is present in the slice selection magnetic field gradient, a slice profile is deteriorated, resulting in deterioration of signal-to-noise ratio of the image.

When the eddy current is present in the frequency encoding magnetic field gradient, non-uniform sampling is performed in a k-space in a direction of the frequency encoding, resulting in deterioration of image resolution, generation of ringing in a boundary portion, and generation of blur which is a deterioration phenomenon of the resolution. An effect of the eddy current appears differently according to an imaging technique, and significantly appears in a magnetic field gradient echo image and a high speed image.

The shield coil may be installed outside the gradient coil in order to resolve problems due to eddy current. In order to offset an intensity of the magnetic field gradient emitted outside the gradient coil and reduce an amount of the eddy current, a current is applied to the shield coil in a direction opposite to a direction of the current applied to the gradient coil.

The MRI apparatus according to an exemplary embodiment includes a shim assembly 168 provided within the gradient coil assembly 152 so that the static magnetic field formed by the main magnet is maintained uniform. The shim assembly 168 includes at least one of a first shim token assembly 176 and a second shim token assembly 174.

As shown in FIGS. 6 to 8, the second shim token assembly 174 a shim tray or trays 170 and a shim token or tokens accommodated in the shim trays 170. Hereinafter, the shim tokens accommodated in the shim tray 170 are referred to as a second shim token or second shim tokens 172 to be distinguished from a shim token installed between the shim trays 170. The shim token or tokens installed between the shim trays 170 are referred to as a first shim token or first shim tokens 180 and are included into the first shim token assembly 176.

As shown in FIG. 8, each shim tray 170 of the second shim token assembly 174 has a length corresponding to a length of the gradient coil assembly 152 in the z-axis direction, and an inner space of the shim tray 170 may be divided into a plurality of spaces so that a plurality of second shim tokens are accommodated in the inner space. Hereinafter, the divided space of the shim tray 170 in which the shim token is accommodated is referred to as a shim pocket or shim pockets 171.

One or more second shim tokens 172 may be accommodated in one shim pocket 171, in a radial direction of the gradient coil assembly. A position of the shim pocket 171 in which the second shim token 172 is to be accommodated, or the number, weight, or size of the second shim tokens 172 to be accommodated in the particular shim pocket 171 may be calculated by using a predefined algorithm in order to improve uniformity of a static magnetic field distribution.

For example, the magnetic field distribution on an imaginary spherical surface is measured while a magnetic field camera including a magnetic field sensor is located at an imaging area within the bore and then rotates at a predefined angle. The magnetic field camera may be formed in a semicircular or circular shape. The optimal arrangement of the second shim token 172 to achieve targeted uniformity of the magnetic field distribution is performed using the measured data of the magnetic field distribution. The arrangement of the second shim token 172 to be accommodated in the shim pocket 171 of each shim tray 170 may be calculated based on the optimized result. The arrangement of the second shim token 172 may include the shim pocket 171 in which the second shim token 172 is to be arranged and information such as the number and weight of the second shim token 172 to be arranged in the shim pocket 171. According to the calculated arrangement of the second shim token 172, the second shim token 172 is arranged in the shim pocket 171 of the shim tray 170.

The shim trays 170 in which the second shim tokens 172 are arranged may be inserted into shim accommodation portions 178 formed within the gradient coil assembly 152 in the z-axis direction and be mounted to the gradient coil assembly 152. The shim accommodation portions into which the shim trays 170 are to be inserted may be formed at a predefined interval along a circumferential direction of the gradient coil assembly 152 during manufacture.

A process of inserting each shim tray 170 into the associated shim accommodation portion to install the shim tray 170 to the gradient coil assembly 152 and of identifying whether the targeted uniformity of the magnetic field distribution is achieved by measuring the magnetic field distribution in the imaging area using the magnetic field camera again may be further performed.

The shim token may be made of silicon steel or cobalt steel, but an exemplary embodiment is not limited thereto. The shim token is magnetized when being placed in the magnetic field, and a direction of the magnetic field produced due to the magnetization of the shim token is opposite to a direction of a peripheral magnetic field. That is, the magnetic field produced due to the magnetization of the shim token offsets the peripheral static magnetic field and reduces the magnitude thereof. The static magnetic field in the imaging area may be uniformly distributed by properly arranging the shim token using properties of such a shim token.

Referring to FIGS. 6 to 8, the first shim token assembly 176 includes one or more first shim tokens 180 installed between the shim trays 170 provided within the gradient coil assembly 152, along the z-axis direction parallel with the z-axis of the gradient coil assembly 152.

According to an exemplary embodiment, the number of the second shim tokens 172 arranged in the shim trays 170 may be reduced by installing the first shim token 180 in a space between the shim trays 170 spaced apart from each other, the thickness of the shim tray 170 may be decreased, in a radial direction.

That is, shimming is performed to a certain extent by installing the first shim token 180 during manufacturing the gradient coil assembly 152 and remaining shimming needed to achieve the targeted uniformity of the static magnetic field is performed through the second shim token 172 arranged in the shim tray 170. As a result, the number of the second shim tokens 172 needed for shimming using the shim tray 170 is reduced, thereby enabling the thickness of the shim tray 170 to be decreased.

Each of the first shim tokens 180 is installed in the space between the shim trays 170, and an installation position of the first shim token 180 is determined as a position corresponding to a selected pocket 171 of the pockets 171 of the adjacent shim trays 170. For example, the installation position of the first shim token 180 is determined as a position on the same line as the 12th, 16th, and 20th shim pockets 171 of the adjacent shim trays 170 in the circumferential direction between the shim trays 170.

Although the first shim tokens 180 are shown as being installed between all of the shim trays 170 in FIG. 6, this is merely an example. For instance, a space in which the first shim token 180 is not installed may also be present among the spaces between the shim trays 170.

Figure 9:
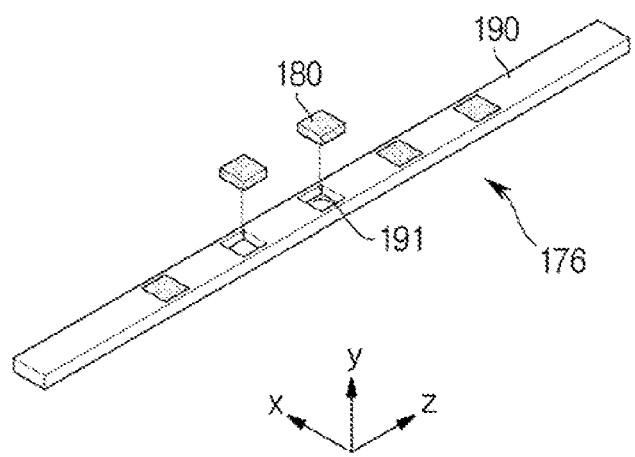
FIG. 9 is a view conceptually illustrating a holder accommodating the first shim tokens according to an exemplary embodiment.
Figure 10:
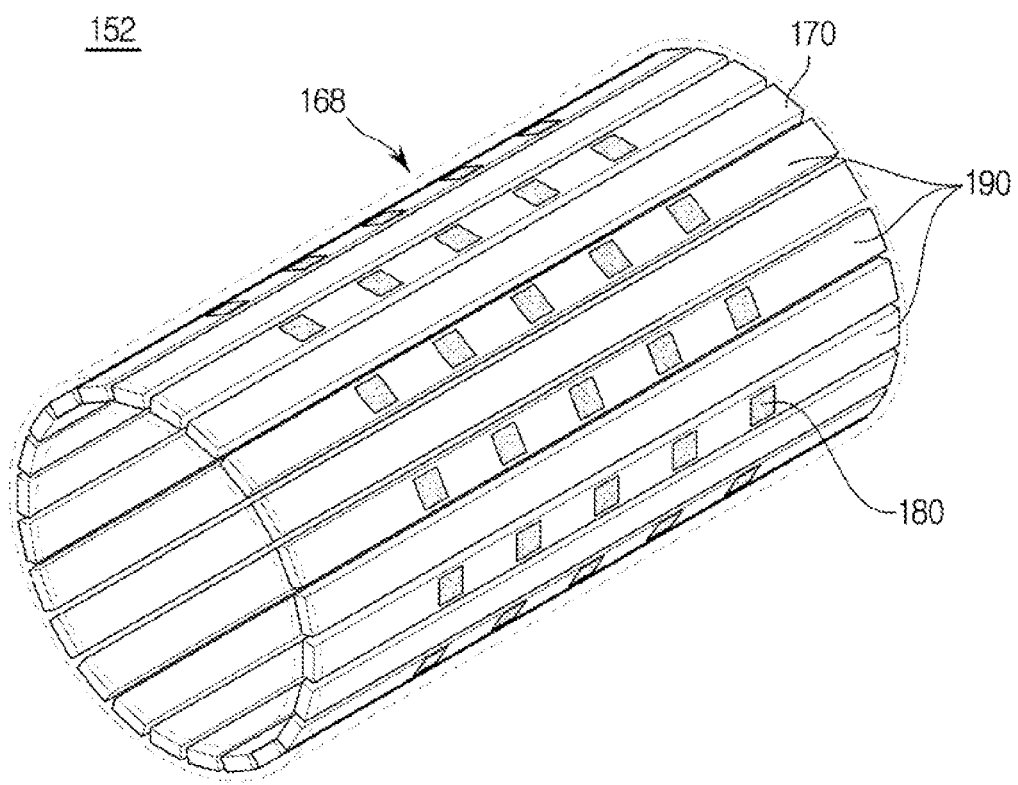
FIG. 10 is view illustrating installation of holders within the gradient coil assembly which accommodate the first shim tokens.

FIG. 9 is a view conceptually illustrating the first shim token assembly 176 including a holder 190 accommodating the first shim tokens 180 according to an exemplary embodiment. FIG. 10 is view illustrating installation of holders 190 within the gradient coil assembly 152 in a state of accommodating the first shim tokens 180 in each holder 190.

As shown in FIG. 9, the first shim tokens 180 may be installed within the gradient coil assembly 152 as being retained in the holder 190 formed with grooves 191 in which the first shim tokens 180 may be accommodated. In comparison, as discussed above with reference to FIGS. 7 and 8, the first shim tokens 180 may be installed without the holder 190.

A position of the groove 191 in the holder 190 accommodating first shim tokens 180 may be determined through optimal arrangement of the first shim tokens 180 to achieve the targeted uniformity of the magnetic field distribution using the data of the magnetic field distribution. That is, the positions of the grooves 191 of the first shim tokens 180 to be formed in each holder 190 may be calculated based on the optimized result. This may be performed using a known algorithm used to arrange the shim tokens in the process of shimming.

As shown in FIG. 10, each holder 190 is installed between the shim accommodation portions into which the shim trays 170 are inserted, and the position of the groove 191 accommodating the first shim token 180 is determined as a position corresponding to a selected pocket 171 of the pockets 171 of the shim trays 170 inserted into the adjacent shim accommodation portions. The position of the groove 191 of the holder 190 is determined and the number, shape, weight, or size of the first shim tokens 180 to be installed in the determined groove 191 may be also determined.

Figure 11:
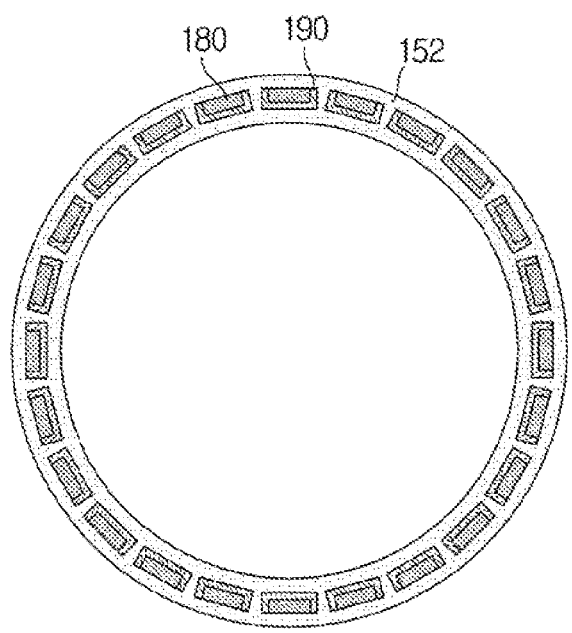
FIG. 11 is a cross-sectional view of a gradient coil assembly according to an exemplary embodiment.
Figure 12:
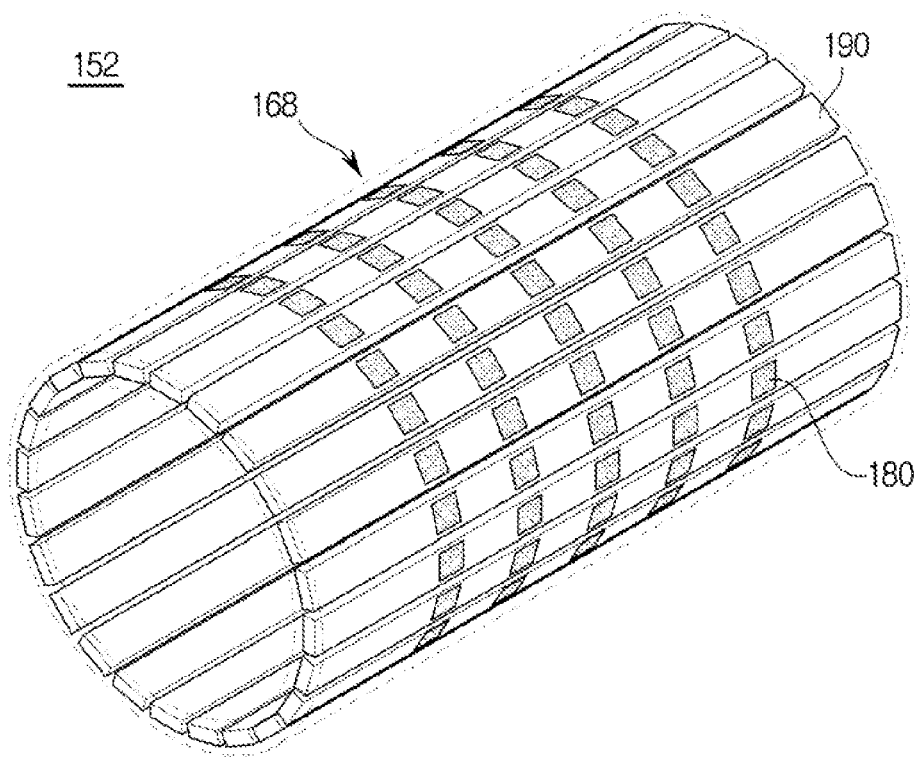
FIG. 12 is view illustrating installation of holders within the gradient coil assembly of FIG. 11.

FIG. 11 is a cross-sectional view of a gradient coil assembly 152 according to an exemplary embodiment. FIG. 12 is view illustrating holders 190 installed within the gradient coil assembly 152 of FIG. 11.

In an exemplary embodiment, only the first shim token assembly 176 including first shim tokens 180 installed within the gradient coil assembly 152 without the shim trays 170 accommodating the second shim tokens.

As described above, the magnetic field distribution on the imaginary spherical surface is measured while the magnetic field camera including the magnetic field sensor is located at the imaging area within the bore and then rotates at a predefined angle. Then, the optimal arrangement of each first shim token 180 to achieve the targeted uniformity of the static magnetic field distribution is performed using the measured data of the magnetic field distribution. The arrangement of the first shim tokens 180 to be installed within the gradient coil assembly 152 may be calculated based on the optimized result. The arrangement of the first shim tokens 180 may include information such as the position, number, and weight of the first shim tokens 180. After the first shim tokens 180 are directly arranged within the gradient coil assembly 152 based on the calculated information, the gradient coil assembly 152 may be manufactured by molding.

The holders 190 accommodating the first shim tokens 180 may be installed within the gradient coil assembly 152, as shown in FIGS. 11 and 12.

As described above, the position of the groove 191 in the holder 190 accommodating each first shim token 180 may be determined through optimal arrangement of the first shim token 180 to achieve the targeted uniformity of the magnetic field distribution using the data of the magnetic field distribution. That is, the positions of the grooves 191 of the first shim tokens 180 to be formed in each holder 190 may be calculated based on the optimized result, by using a known algorithm. The position of the groove 191 of the holder 190 is determined and the number, shape, weight, or size of the first shim tokens 180 to be installed in the determined groove 191 may be also determined. After the holder 190 accommodating the first shim token 180 is arranged within the gradient coil assembly 152 based on the calculated information, the gradient coil assembly 152 may be manufactured by molding.

When the first token 180 is installed to the gradient coil assembly 152, a process of identifying whether the targeted uniformity of the magnetic field distribution is achieved by measuring the magnetic field distribution in the imaging area using the magnetic field camera again may also be further performed. As a result, when additional shimming is needed, the shimming may also be performed through a superconductive shim method. In this case, a superconductive shim coil may be provided in the gradient coil assembly 152 in order to perform superconductive shimming.

Figure 13:
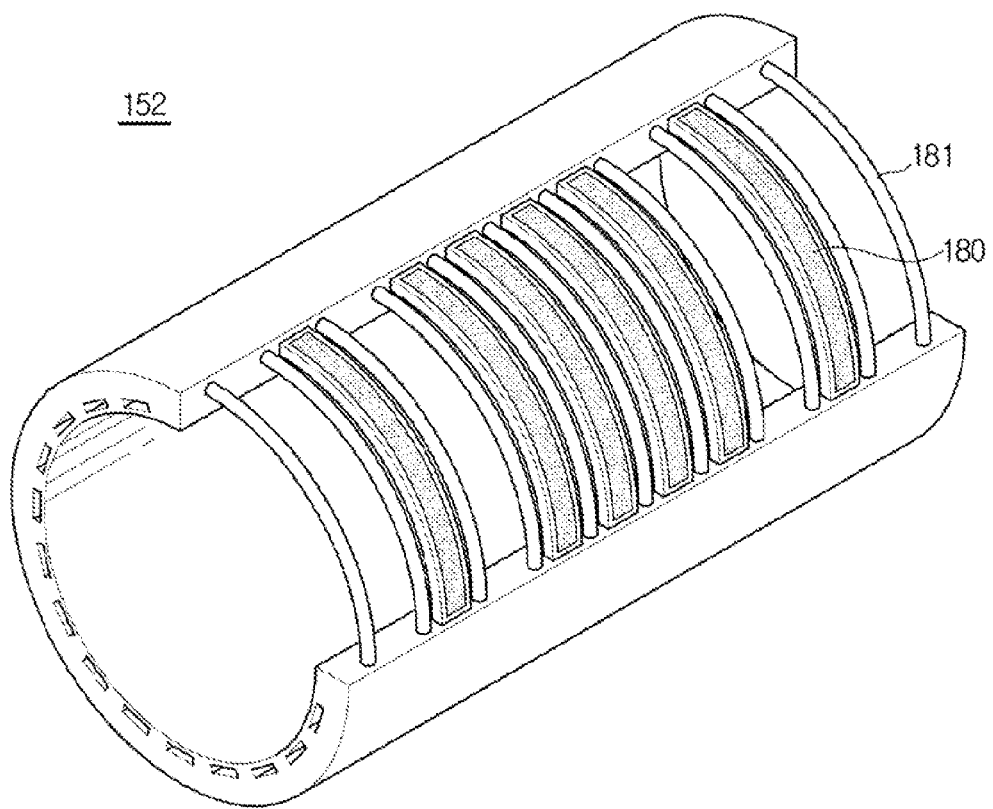
FIGS. 13, 14, and 15 are views illustrating a structure of a first shim token installed within the gradient coil assembly according to an exemplary embodiment.
Figure 14:
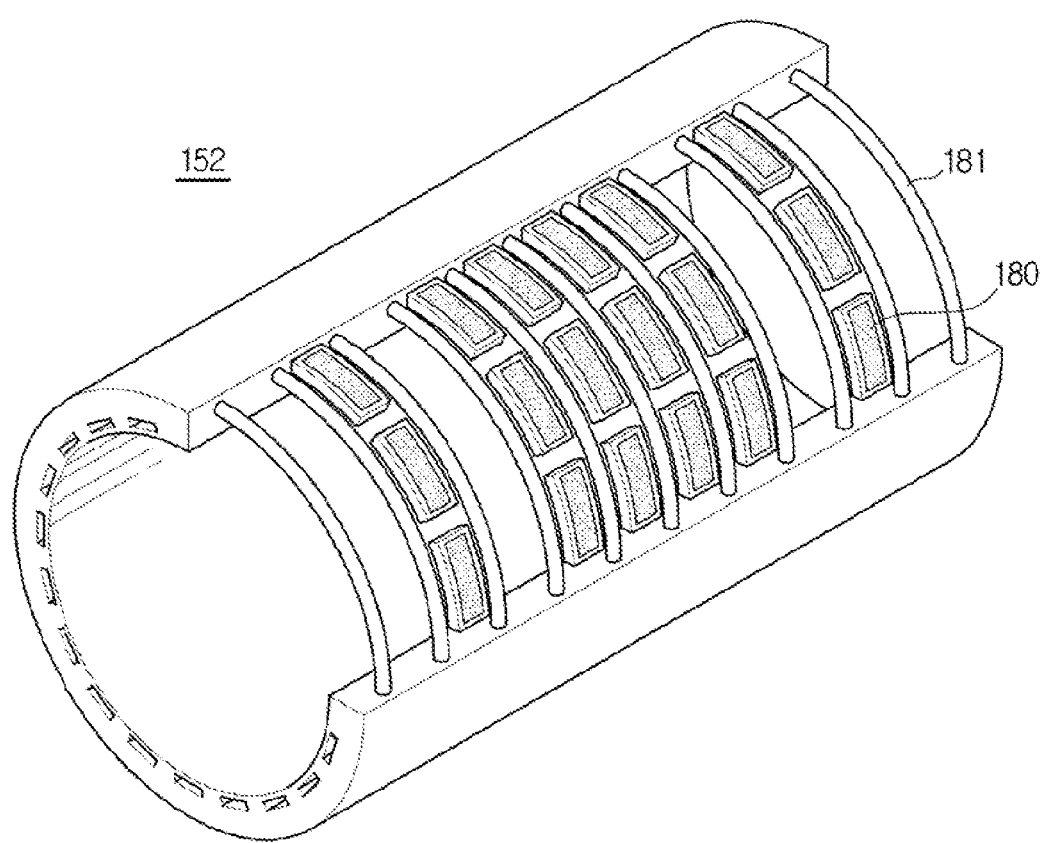
Figure 15:
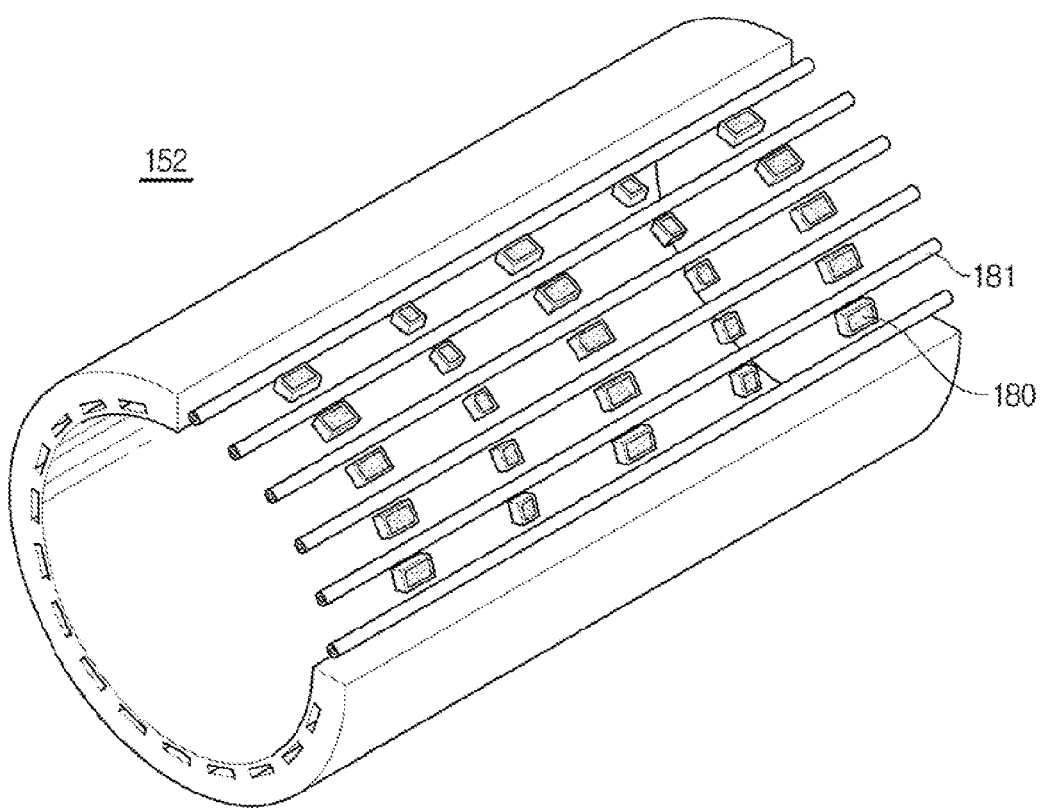

Meanwhile, when a current is applied to the gradient coil 170 or the shield coil, heat is generated due to resistance of the coil. The generated heat causes an increase in temperature of the shim token. Since a change in temperature of the shim token is a factor changing uniformity of the static magnetic field, the gradient coil assembly 152 may include cooling portions 181 to cool heat transferred to the shim token so as not to increase the temperature of the shim token. FIGS. 13 to 15 are views illustrating a structure of a first shim token installed within the gradient coil assembly according to an exemplary embodiment, in which various examples of installation of a first shim token according to the installation type of the cooling portion.

Referring to FIGS. 13 and 14, the cooling portion 181 may be provided in the form of a pipe, and provided within the gradient coil assembly 152 while extending in a circumferential direction of the gradient coil assembly 152. Referring to FIG. 13, the cooling portion 181, which may have a circular shape or ring shape extending in the circumferential direction, may be installed within the gradient coil assembly 152 at a predefined interval in a central axis direction of the gradient coil assembly 152. The first shim tokens 180 may be provided between the cooling portions 181 as shown in FIG. 13. In this case, the first shim tokens 180 may be also provided in a shape extending in the circumferential direction of the gradient coil assembly 152 in the same manner as the cooling portion 181. That is, the first shim token 180 having a ring shape extending in the circumferential direction of the gradient coil assembly 152 may be installed between the cooling portions 181. Alternatively, as shown in FIG. 14, the first shim token 180 provided with a plurality of divisions may be installed between the cooling portions 181.

FIG. 15 illustrates another example of installation of the cooling portion. Referring to FIG. 15, the cooling portion 181 may be provided within the gradient coil assembly 152 while extending in a central axis direction of the gradient coil assembly 152. Each of the cooling portions 181 extending in the central axis direction may be installed within the gradient coil assembly 152 at a predefined interval in a circumferential direction of the gradient coil assembly 152 as shown in FIG. 15. The first shim token 180 may be provided between the cooling portions 181. Referring to FIG. 15, a plurality of first shim tokens 180 are installed between the cooling portions 181.

Figure 16:
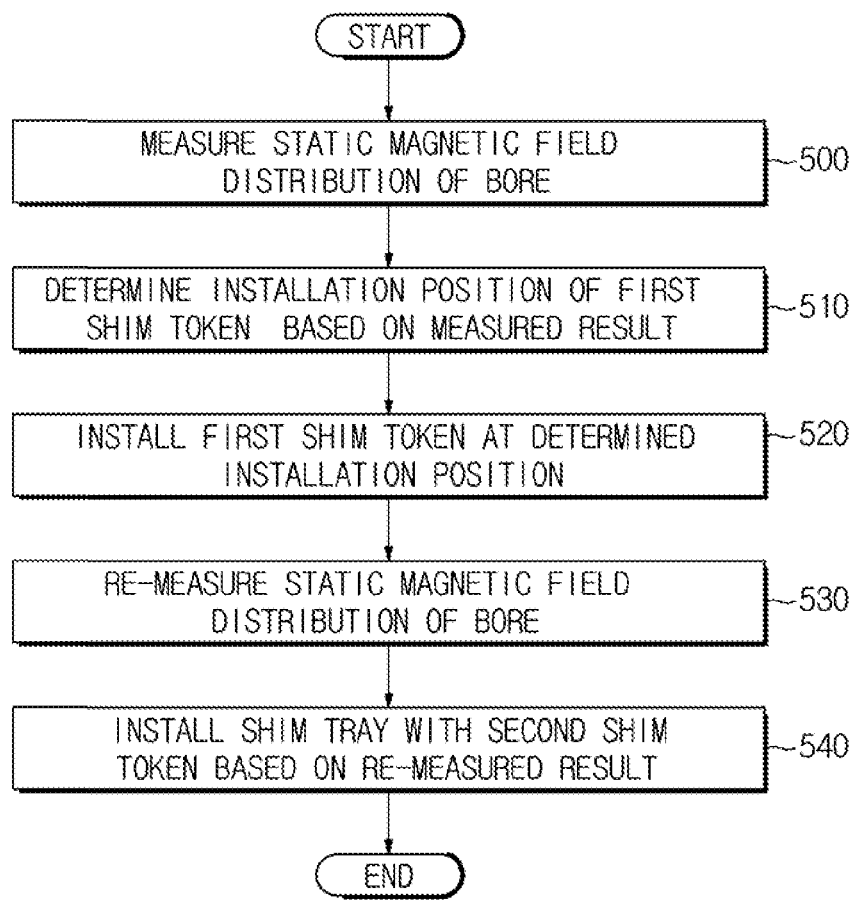
FIG. 16 is a flowchart illustrating a method of manufacturing the MRI apparatus according to an exemplary embodiment.
Figure 17:
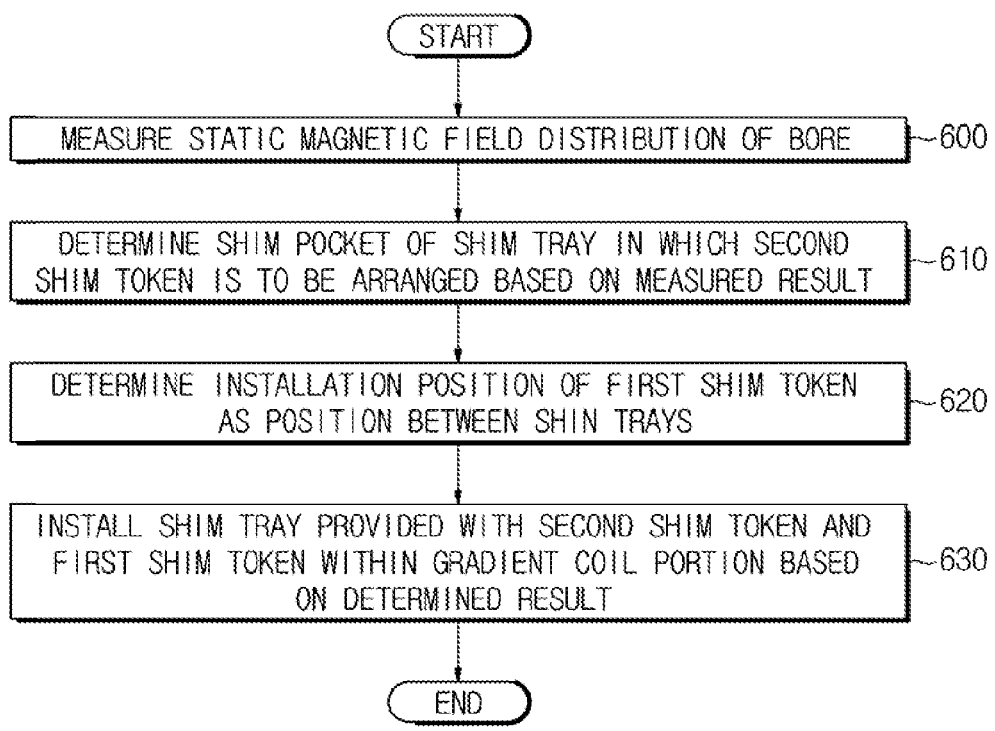
FIG. 17 is a flowchart illustrating a method of manufacturing the MRI apparatus according to an exemplary embodiment.

FIGS. 16 and 17 are flowcharts illustrating a method of manufacturing the MRI apparatus according to the exemplary embodiments.

Referring to FIG. 16, a static magnetic field distribution of the bore is first measured (operation 500). For example, the magnetic field distribution on an imaginary spherical surface is measured while a magnetic field camera including a magnetic field sensor is located at an imaging area within the bore and then rotates at a predefined angle. The magnetic field camera may be formed in a semicircular or circular shape.

An installation position of the first shim token 180 within the gradient coil assembly 152 is determined based on the measured result (operation 510), and the first shim token 180 is installed at the determined installation position (operation 520).

Optimal arrangement of the first shim token 180 to achieve the targeted uniformity of the magnetic field distribution is performed using the measured data of the magnetic field distribution. The installation position of the first shim token 180 in a space between each of the shim trays 170 may be calculated based on the optimized result. This may be performed using a known algorithm used to arrange the shim token in the shim pocket 171 of the shim tray 170 in the process of shimming. Accordingly, the first shim token 180 is installed between the shim accommodation portions into which the shim trays 170 are inserted, and the installation position of the first shim token 180 is determined as a position corresponding to a selected pocket 171 of the pockets 171 of the shim trays 170 inserted into the adjacent shim accommodation portions. For example, the installation position of the first shim token 180 may be determined as a position on the same line as the 12th, 16th, and 20th shim pockets 171 of the shim trays 170 in the circumferential direction among the spaces between the adjacent shim accommodation portions. The installation position of the first shim token 180 is determined and the number, shape, weight, or size of the first shim token 180 to be installed in the determined installation position may be also determined.

As such, when the installation position of the first shim token 180 and a specification including the number, shape, weight, or size of the first shim token 180 to be installed in the position are determined, the first shim token 180 is installed within the gradient coil assembly 152 based on the same.

The first shim token 180 may be directly installed within the gradient coil assembly 152 as shown in FIGS. 6 to 8, or may be installed within the gradient coil assembly 152 as being accommodated in the holder 190.

When the first shim token 180 is installed, a static magnetic field distribution of the bore is re-measured (operation 530) and the shim tray 170 provided with the second shim token 172 is installed within the gradient coil assembly 152 based on the measured result (operation 540).

When the first shim token 180 is installed, the shim pocket 171 of the shim tray 170 in which the second shim token 172 is to be arranged is determined by re-measuring the static magnetic field distribution. The magnetic field distribution on an imaginary spherical surface is re-measured while a magnetic field camera including a magnetic field sensor is located at an imaging area within the bore and then rotates at a predefined angle. Optimal arrangement of the second shim token 172 to achieve the targeted uniformity of the static magnetic field distribution is performed using the re-measured data of the magnetic field distribution. The arrangement of the second shim token 172 to be accommodated in the shim pocket 171 of each shim tray 170 may be calculated based on the optimized result. The arrangement of the second shim token 172 may include the shim pocket 171 in which the second shim token 172 is to be arranged and a specification such as the number and weight of the second shim token 172 to be arranged in the shim pocket 171. According to the calculated arrangement of the second shim token 172, the second shim token 172 is arranged in the shim pocket 171 of the shim tray 170.

When the second shim token 172 is arranged in the shim tray 170, the shim tray 170 is inserted into the shim accommodation portion formed within the gradient coil assembly 152 in the z-axis direction and is installed within the gradient coil assembly 152.

As described above, when shimming is performed by installing the first shim token 180 in a space between the shim trays 170 spaced apart from each other, the number of the second shim tokens 172 arranged in the shim tray 170 may be reduced, thereby enabling the thickness of the shim tray 170 to be decreased.

That is, the shimming is performed to a certain extent by installing the first shim token 180 during manufacture of the gradient coil assembly 152 and the remaining shimming needed to achieve the targeted uniformity of the static magnetic field is performed through the second shim token 172 arranged in the shim tray 170. As a result, the number of the second shim tokens 172 needed for shimming using the shim tray 170 is reduced, thereby enabling the thickness of the shim tray 170 to be decreased. Consequently, the inner diameter of the bore may be increased.

When the first shim token 180 is installed and the shim tray 170 including the second shim token 172 is also installed, a process of identifying whether the targeted uniformity of the magnetic field distribution is achieved by measuring the magnetic field distribution in the imaging area using the magnetic field camera again may also be further performed.

Referring to FIG. 17, a static magnetic field distribution of the bore is first measured (operation 600). For example, the magnetic field distribution on an imaginary spherical surface is measured while a magnetic field camera including a magnetic field sensor is located at an imaging area within the bore and then rotates at a predefined angle. The magnetic field camera may be formed in a semicircular or circular shape.

The shim pocket 171 of the shim tray 170 in which the second shim token 172 is to be arranged is determined based on the measured result (operation 610), and an installation position of the first shim token 180 is determined as at least one position between the shim trays 170 among positions corresponding to the shim pockets 171 (operation 620).

Optimal arrangement of the first and second shim tokens 180 and 172 to achieve the targeted uniformity of the magnetic field distribution is performed using the measured data of the magnetic field distribution. The arrangement of the second shim token 172 to be accommodated in the shim pocket 171 of each shim tray 170 may be calculated based on the optimized result. The arrangement of the second shim token 172 may include the shim pocket 171 in which the second shim token 172 is to be arranged and a specification of the second shim token 172 including the number, shape, weight, or size of the second shim token 172 to be arranged in the shim pocket 171. According to the calculated arrangement of the second shim token 172, the second shim token 172 is arranged in the shim pocket 171 of the shim tray 170.

The installation position of the first shim token 180 in a space between each of the shim trays 170 may be calculated based on the optimized result. The first shim token 180 is installed between the shim accommodation portions into which the shim trays 170 are inserted, and the installation position of the first shim token 180 is determined as a position corresponding to a selected pocket 171 of the pockets 171 of the shim trays 170 inserted into the adjacent shim accommodation portions. For example, the installation position of the first shim token 180 may be determined as a position on the same line as the 12th, 16th, and 20th shim pockets 171 of the shim trays 170 in the circumferential direction among the spaces between the adjacent shim accommodation portions. The installation position of the first shim token 180 is determined and the number, shape, weight, or size of the first shim token 180 to be installed in the determined installation position may be determined together therewith.

Unlike exemplary embodiment illustrated in FIG. 16, the present exemplary embodiment may involve calculating information related to the arrangement of the first and second shim tokens 180 and 172 together after measurement of the static magnetic field distribution and may simultaneously install the first shim token 180 and the shim tray 170 within the gradient coil assembly 152.

The shim tray 170 provided with the second shim token 172 and the first shim token 180 are installed within the gradient coil assembly 152 based on the determined result (operation 630).

When the installation position of the first shim token 180 and the specification including the number, shape, weight, or size of the first shim token 180 to be installed in the position are determined, the first shim token 180 is installed within the gradient coil assembly 152 based on the same. The second shim token 172 is arranged in the shim pocket 171 of the shim tray 170 according to the determined arrangement of the second shim token 172. When the second shim token 172 is arranged in the shim tray 170, the shim tray 170 is inserted into the shim accommodation portion formed within the gradient coil assembly 152 in the z-axis direction and is installed within the gradient coil assembly 152.

By installing the first shim token 180 in a space between the shim trays 170 and performing the shimming of the static magnetic field together with the shim tray 170, the number of the second shim tokens 172 arranged in the shim tray 170 may be reduced, thereby enabling the thickness of the shim tray 170 to be decreased. Consequently, the inner diameter of the bore may be increased.

When the first shim token 180 is installed and the shim tray 170 including the second shim token 172 is also installed, a process of identifying whether the targeted uniformity of the magnetic field distribution is achieved by measuring the magnetic field distribution in the imaging area using the magnetic field camera again may also be further performed.

As is apparent from the above description, a shim token is installed in a space between shim trays independently of a shim token arranged in each shim tray, thereby enabling a thickness of the shim tray to be decreased.

Thus, due to a decrease in the thickness of the shim tray, an inner space of a bore may be prevented from being decreased.

Furthermore, since the number of the shim tokens arranged in the shim trays may be reduced by installing the first shim token, replacement of the shim trays for additional shimming may be performed with less force.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus comprising:
    a static magnetic field coil assembly configured to form a static magnetic field in a bore; and
    a gradient coil assembly which is configured to form a gradient magnetic field in the static magnetic field and includes a first shim token provided therein so that a distribution of the static magnetic field is uniform,
    wherein the first shim token is installed in a space provided between two adjacent shim trays disposed within the gradient coil assembly.

2. The MRI apparatus of claim 1, wherein the first shim token is installed at a position between the shim trays corresponding to a position of at least one of a plurality of shim pockets in the shim trays.

3. The MRI apparatus of claim 1, wherein the gradient coil assembly includes holders provided between the shim trays, each of the holders including a respective first shim token disposed therein.

4. The MRI apparatus of claim 3, wherein each of the holders accommodates the first shim token at a position corresponding to a position of at least one of a plurality of shim pockets of the shim trays.

5. The MRI apparatus of claim 1, wherein the gradient coil assembly includes holders which are parallel to a central axis of the bore and are arranged at a predefined interval along a circumferential direction of the bore, each of the holders including a respective first shim token disposed therein.

6. The MRI apparatus of claim 5, wherein the respective first shim tokens are installed in corresponding holders at a predefined interval in parallel to the central axis of the bore.

7. The MRI apparatus of claim 1, wherein the gradient coil assembly includes a plurality of cooling portions provided at a predefined interval.

8. The MRI apparatus of claim 7, wherein the first shim token is provided between the plurality of cooling portions.

9. The MRI apparatus of claim 7, wherein each of the plurality of cooling portions is an elongated member extending in a circumferential direction of the gradient coil assembly, and
    the elongated members are provided at the predefined interval along a central axis direction of the gradient coil assembly.

10. The MRI apparatus of claim 9, wherein the first shim token is provided between the elongated members which extend in the circumferential direction and are formed along the central axis direction.

11. The MRI apparatus of claim 7, wherein each of the plurality of cooling portions is an elongated member extending in a central axis direction of the gradient coil assembly, and
    the elongated members are provided at the predefined interval along a circumferential direction of the gradient coil assembly.

12. The MRI apparatus of claim 11, wherein the first shim token is provided between two adjacent elongated members which extend in the central axis direction and are formed along the circumferential direction.

13. The MRI apparatus of claim 1, wherein the shim trays extend in a central axis direction of the gradient coil assembly, and
    the space extends in the central axis direction and in a direction perpendicular to the central axis direction, between the two adjacent shim trays.

14. The MRI apparatus of claim 1, wherein a groove is provided in the space, and
    the first shim token is installed in the groove.

15. A magnetic resonance imaging (MRI) apparatus comprising:
    a static magnetic field coil assembly configured to form a static magnetic field in a bore; and a gradient coil assembly, which is configured to form a gradient magnetic field in the static magnetic field, and includes:
  shim trays arranged in the gradient coil assembly at a predefined interval with a space therebetween, and
  first shim tokens including at least one first shim token provided in the space between two adjacent shim trays.

16. The MRI apparatus of claim 15, wherein the gradient coil assembly includes:
  a plurality of shim accommodation portions configured to extend in a direction parallel to a central axis of the gradient coil assembly so that the shim trays are insertable into the shim accommodation portions and are provided at the predefined interval along a circumferential direction of the gradient coil assembly;
  wherein the shim trays include a plurality of shim pockets, respectively, for accommodating second shim tokens, and
  the first shim tokens are provided between the shim trays along the direction parallel to the central axis.

17. The MRI apparatus of claim 15, wherein the at least one first shim token is installed at a position between the shim trays corresponding to a position of at least one of a plurality of shim pockets in the shim trays.

18. The MRI apparatus of claim 15, wherein the gradient coil assembly includes a plurality of holders which are arranged between the shim trays and include the first shim tokens disposed therein.

19. The MRI apparatus of claim 18, wherein each of the holders accommodates the first shim token at a position corresponding to a position of at least one of a plurality of shim pockets of the shim trays.

20. A method for a magnetic resonance imaging (MRI) apparatus, the method comprising:
  measuring a static magnetic field distribution of a bore;
  determining an installation position of a first shim token within a gradient coil assembly in order to improve uniformity of the static magnetic field distribution, based on a result of the measuring; and
  installing the first shim token at the determined installation position within the gradient coil assembly,
  wherein the determining the installation position of the first shim token includes determining the installation position of the first shim token as at least one position between shim trays among positions corresponding to shim pockets of the shim trays in order to improve uniformity of the static magnetic field distribution, based on the result of the measuring, and
  the first shim token is installed in a space provided between two adjacent shim trays.

21. The method of claim 20, wherein the determining the installation position of the first shim token comprises determining at least one among a number, shape, a weight, and a size of the first shim token to be installed at the determined installation position.

22. The method of claim 20, further comprising, when the first shim token is installed, re-measuring the static magnetic field distribution of the bore and installing the shim trays provided with a second shim token within the gradient coil assembly based on the re-measured static magnetic field distribution.

23. The method of claim 22, wherein the re-measuring includes:
  re-measuring the static magnetic field distribution of the bore; and
  determining a shim pocket of at least one of the shim trays in which the second shim token is to be arranged in order to improve uniformity of the static magnetic field distribution, based on a result of the re-measuring; and
  arranging the second shim token in the determined shim pocket.

24. The method of claim 23, further comprising determining at least one among a number, a shape, a weight, and a size of the second shim token to be arranged at the determined shim pocket.

25. The method of claim 22, further comprising:
  when the shim tray is installed, measuring the static magnetic field of the bore and determining whether uniformity of the measured static magnetic field is above a predetermined reference uniformity.

26. A method for a magnetic resonance imaging (MRI) apparatus, the method comprising:
  measuring a static magnetic field distribution of a bore;
  determining shim pockets of shim trays in which each second shim token is to be arranged in order to improve uniformity of the static magnetic field distribution, based on a result of the measuring;
  determining an installation position of a first shim token as at least one position between the shim trays among positions corresponding to the determined shim pockets, based on the result of the measuring;
  installing the first shim token in a space provided between two adjacent shim trays, based on the determined installation position; and
  installing the shim trays provided with the second shim tokens within a gradient coil assembly, based on the determined shim pockets.

27. The method of claim 26, wherein the determining the shim pockets of the shim trays includes:
  determining at least one among a number, a shape, a weight, and a size of the second shim tokens to be arranged in the determined shim pockets, respectively.

28. The method of claim 26, wherein the determining the installation position of the first shim token includes:
  determining at least one among a number, a shape, a weight, and a size of the first shim token to be installed at the determined installation position.

29. The method of claim 26, further comprising, when the shim trays and the first shim token are installed within the gradient coil assembly, measuring the static magnetic field of the bore and determining whether uniformity of the measured static magnetic field is above a predetermined reference uniformity.

* * * * *